United States Patent
Konishi

(10) Patent No.: US 8,653,570 B2
(45) Date of Patent: Feb. 18, 2014

(54) SOLID-STATE IMAGE CAPTURING ELEMENT AND DRIVING METHOD FOR THE SAME, METHOD FOR MANUFACTURING SOLID-STATE IMAGE CAPTURING ELEMENT, AND ELECTRONIC INFORMATION DEVICE

(75) Inventor: Takefumi Konishi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 498 days.

(21) Appl. No.: 12/757,359

(22) Filed: Apr. 9, 2010

(65) Prior Publication Data

US 2010/0259658 A1  Oct. 14, 2010

(30) Foreign Application Priority Data

Apr. 10, 2009  (JP) .................................. 2009-96445
Aug. 31, 2009  (JP) ................................ 2009-200447

(51) Int. Cl.
*H01L 31/18* (2006.01)
(52) U.S. Cl.
USPC ........................................ 257/292; 257/294
(58) Field of Classification Search
USPC .................. 257/290–294, 431–448, E31.073, 257/E31.127, E27.133
See application file for complete search history.

(56) References Cited

U.S. PATENT DOCUMENTS

| 7,846,758 B2 | 12/2010 | Ohkawa | |
| 8,004,019 B2 * | 8/2011 | Fujita et al. | 257/291 |
| 8,072,015 B2 * | 12/2011 | Itonaga | 257/294 |
| 2010/0237390 A1 * | 9/2010 | Kenichi | 257/226 |
| 2011/0045629 A1 | 2/2011 | Ohkawa | |

FOREIGN PATENT DOCUMENTS

| CN | 1905201 A | 1/2007 |
| EP | 1 748 489 A2 | 1/2007 |
| JP | 3724374 | 9/2005 |
| JP | 2007-036083 A | 2/2007 |
| JP | 2008-066480 A | 3/2008 |
| KR | 10-2007-0014925 A | 2/2007 |

OTHER PUBLICATIONS

Chinese Office Action and English Translation thereof mailed Oct. 19, 2011 in Chinese application 201010164306.2.
Japanese Office Action mailed Sep. 28, 2011 in Japanese application 2009-200447.

* cited by examiner

Primary Examiner — Cuong Q Nguyen
(74) Attorney, Agent, or Firm — Nixon & Vanderhye P.C.

(57) ABSTRACT

A solid-state image capturing element includes, disposed in a surface portion from an upper part of the photodiode region to the electric charge detecting section: a second conductivity type first region; a second conductivity type second region; and a second conductivity type third region, one end of which is adjacent to the second conductivity type second region and the other end of which is adjacent to the electric charge detecting section, where each impurity concentration of the first, second and third regions is set in a manner to form an electric field being directed from the second conductivity type first region through the second conductivity type second region to the second conductivity type third region.

11 Claims, 12 Drawing Sheets

Fig. 10
(a) 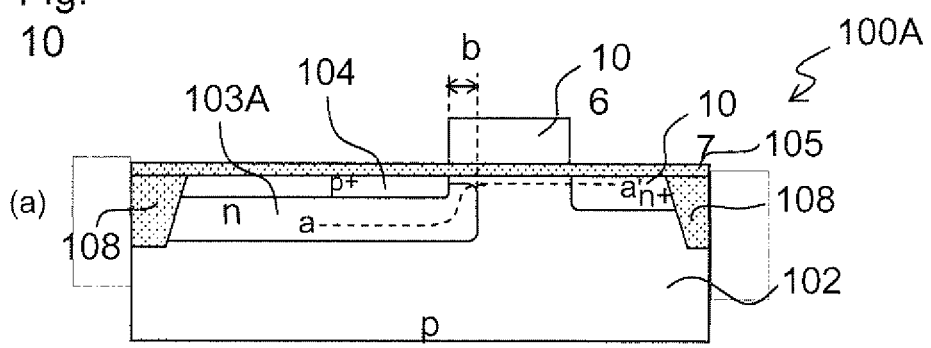
(b) 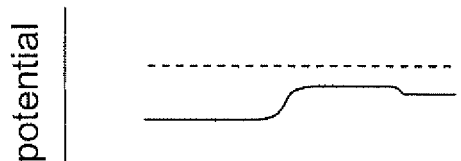
(c) 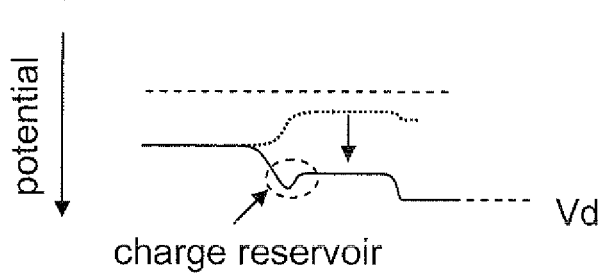

US 8,653,570 B2

SOLID-STATE IMAGE CAPTURING ELEMENT AND DRIVING METHOD FOR THE SAME, METHOD FOR MANUFACTURING SOLID-STATE IMAGE CAPTURING ELEMENT, AND ELECTRONIC INFORMATION DEVICE

This nonprovisional application claims priority under 35 U.S.C. §119(a) to Patent Application No. 2009-096445 filed in Japan on Apr. 10, 2009 and No. 2009-200447 filed in Japan on Aug. 31, 2009, the entire contents of which are hereby incorporated by reference.

BACKGROUND AND SUMMARY

1. Technical Field of the Invention

The technology presented herein is related to: a solid-state image capturing element, which is constituted of a semiconductor element for performing a photoelectric conversion on and capturing an image of image light from a subject, a method for driving the solid-state image capturing element, and a method for manufacturing the solid-state image capturing element, and more particularly, to a solid-state image capturing element such as a MOS type image sensor capable of being driven with low electric power consumption, a method for driving the solid-state image capturing element, and a method for manufacturing the solid-state image capturing element; and an electronic information device, such as a digital camera (e.g., a digital video camera or a digital still camera), an image input camera (e.g., a monitoring camera), a scanner, a facsimile machine, a television telephone device and a camera-equipped cell phone device, including the solid-state image capturing element as an image input device used in an image capturing section thereof

2. Description of the Related Art

For example, CCD type solid-state image capturing elements, MOS type solid-state image capturing elements and other semiconductor image sensors are excellent for mass production, and therefore, have been conventionally used as image input devices in digital cameras, such as digital video cameras and digital still cameras, camera-equipped cell phone devices and other portable electronic information devices.

Such conventional portable electronic information devices are driven by batteries, and therefore, it is important to achieve the lowering of the voltage of the driving electricity and the lowering of the electric power consumption. Further, it is also important to achieve the lowering of the cost and the reduction of the module size.

For this reason, in the field of solid-state image capturing elements used in portable electronic information devices, the MOS type solid-state image capturing elements consume less electric power than the CCD type solid-state image capturing elements. In addition, by using conventional CMOS processing technologies, the cost reduction becomes possible. By forming sensor elements and their peripheral circuit elements on the same chip, the reduction of the module size becomes possible. With such and other advantages, the MOS type solid-state image capturing elements are being more focused on.

In addition, the conventional MOS type solid-state image capturing elements with a buried photodiode as a light signal detecting section are remarkably advantageous in terms of achieving noise reduction, and can obtain high quality images.

FIG. 9(a) is a longitudinal cross sectional view of a conventional MOS type solid-state image capturing element disclosed as a conventional example in Reference 1, illustrating the solid-state image capturing element for one pixel. FIGS. 9(b) and 9(c) are each a potential distribution diagram illustrating a transferring path for signal charges, which consists of a photoelectric conversion and accumulation section, a channel region below a gate electrode, and an electric charge detecting section and is taken along a dotted line a-a' in FIG. 9(a). FIG. 9(b) is a potential distribution diagram in a case where a transfer pulse $\phi_{TX}$ applied to a transfer gate electrode is at a low level. FIG. 9(c) is a potential distribution diagram in a case where the transfer pulse $\phi_{TX}$ applied to a transfer gate electrode is at a high level.

FIGS. 9(a) and 9(b) illustrate a conventional type MOS type image sensor 100 with a buried photodiode and a case where a transfer pulse $\phi_{TX}$ applied to a transfer gate electrode 106 is at a low level. Herein, a photoelectric conversion and accumulation section 103 formed in a p-type well region 102 is separated from a surface of a semiconductor substrate by a p-type pinning layer 104 in the surface of the semiconductor substrate. This prevents noise electric charges, which are generated at an interface between the p-type well region 102 and an insulation film 105 formed in a semiconductor substrate 101, from flowing into the photoelectric conversion and accumulation section 103 to be a dark voltage component.

However, in a case where the transfer pulse $\phi_{TX}$ applied to a transfer gate electrode 106 is at a high level as illustrated in FIG. 9(c), the p-type pinning layer 104 in the surface of the semiconductor substrate has an influence on the electric charge transferring path a-a', and a potential barrier is formed, which is an obstructing barrier for the transferring of light signal charges from the photoelectric conversion and accumulation section 103 to an electric charge detecting section 107.

Owing to the potential barrier, signal charges remain in the photoelectric conversion and accumulation section 103 and the signal charges from the photodiode cannot be transferred completely when the signal charges are read out. This condition causes problems such as the production of noise, difficulty in the noise reduction, and the creation of after images.

In order to prevent such after images from being created, Reference 1 discloses a method for changing a positional relationship between the photoelectric conversion and accumulation section 103 and the high concentration, p-type pinning layer 104 thereabove with relation to the transfer gate electrode 106, as in FIGS. 10(a) to 10(c).

FIG. 10(a) is a longitudinal cross sectional view of another conventional MOS type solid-state image capturing element disclosed as a conventional example in Reference 1, illustrating the solid-state image capturing element for one pixel. FIGS. 10(b) and 10(c) are each a potential distribution diagram illustrating a transferring path for signal charges, which consists of a photoelectric conversion and accumulation section, a channel region below a transfer gate electrode, and an electric charge detecting section and is taken along the dotted line a-a' in FIG. 10(a). FIG. 10(b) is a potential distribution diagram in a case where a transfer pulse $\phi_{TX}$ applied to a transfer gate electrode is at a low level. FIG. 10(c) is a potential distribution diagram in a case where the transfer pulse $\phi_{TX}$ applied to a transfer gate electrode is at a high level.

A MOS type image sensor 100A illustrated in FIG. 10(a) includes an overlapping structure, where a transfer gate electrode 106 overlaps a photoelectric conversion and accumulation section 103A. Therefore, as illustrated in FIG. 10(c), the potential barrier illustrated in FIG. 9(c) is cleared away and the after images can be suppressed.

Since the photoelectric conversion and accumulation section 103A has the overlapping structure with respect to the transfer gate electrode 106, the above-described electric barrier is cleared away by a tip portion of the photoelectric conversion and accumulation section 103A being extended below the transfer gate electrode 106. On the other hand, the extending width of the tip portion of the photoelectric conversion and accumulation section 103A becomes wider below the transfer gate electrode 106 as illustrated in FIG. 10(a) when the concentration of the photoelectric conversion and accumulation section 103A is increased in order to sufficiently secure an accumulatable capacity of the electric charges. As a result, a charge reservoir as circled by a dotted line in FIG. 10(c) is formed below the transfer gate electrode 106, which causes a problem of creating an after image.

In order to solve the problem, Reference 1 proposes a MOS type solid-state image with a cross sectional structure as illustrated in FIG. 11(a).

FIG. 11(a) is a cross sectional view of a transferring path for signal charges from a photodiode section to an electric charge detecting section via a transferring transistor in a conventional MOS type solid-state image capturing element disclosed in Reference 1 (in the case of 0≤b≤c). FIGS. 11(b) and 11(c) are each a potential distribution diagram illustrating a transferring path for signal charges, which consists of a photoelectric conversion and accumulation section, a channel region below a transfer gate electrode, and an electric charge detecting section and is taken along a dotted line a-a' in FIG. 11(a). FIG. 11(b) is a potential distribution diagram in a case where a transfer pulse $\phi_{TX}$ applied to a transfer gate electrode is at a low level. FIG. 11(c) is a potential distribution diagram in a case where the transfer pulse $\phi_{TX}$ applied to a transfer gate electrode is at a high level. In FIG. 11, note that the members having the same function and effect as the corresponding ones in FIGS. 9 and 10 are added with the same reference numerals for explanation.

In a unit pixel section in a MOS type image sensor 100B as illustrated in FIGS. 11(a) to 11(c), a p-type pinning layer 104 is formed offset such that a tip portion thereof is shifted with respect to a photoelectric conversion and accumulation section 103B. Herein, the photoelectric conversion and accumulation section 103B is formed extending up to below a transfer gate electrode 106, overlapping the transfer gate electrode 106 (in a plan view). Owing to this, in the electric charge transferring path from the photoelectric conversion and accumulation section 103B to an electric charge detecting section 107 (FD), the formation of a potential barrier is suppressed, which can be seen in the conventional MOS type image sensor 100 illustrated in FIG. 9(c).

As illustrated in FIG. 10(c), the charge reservoir is formed in the conventional MOS type image sensor 100A. However, in the case where the photoelectric conversion and accumulation section 103B overlaps the transfer gate electrode 106, a p-type well region 102C is formed closer to the electric charge detecting section 107 (FD) with respect to the photoelectric conversion and accumulation section 103B in the MOS type solid-state image capturing element 100B. As a result, an n-type low concentration semiconductor region 101B of an n-type semiconductor substrate 101 remains existing between the photoelectric conversion and accumulation section 103B and the p-type well region 102C. Thus, compared to the cross sectional structure in FIG. 10(a), the overlapping width of the photoelectric conversion and accumulation section 103B over the transfer gate electrode 106 the distance illustrated by the arrow b in FIG. 11(a)) can be narrower, thereby avoiding the conventional formation of the charge reservoir that causes after images.

As described above, the MOS type solid-state image capturing element 100B in FIG. 11 and disclosed in Reference 1 can transfer electric charges completely from the photodiode section to the electric charge detecting section 107 to obtain high quality images, in which noise and after images are further suppressed.

FIG. 12 is a longitudinal cross sectional view of a conventional MOS type solid-state image capturing element disclosed in Reference 2, illustrating the MOS type solid-state image capturing element for one pixel.

In FIG. 12, a conventional MOS type solid-state image capturing element 200 includes: an N type photodiode region 203 formed in a P type well 202 above a silicon substrate 201; a gate electrode 204, one end of which is adjacent to the photodiode region 203; an N type drain region 205, which is adjacent to the other end of the gate electrode 204; and an element separating region 206, which has an STI structure surrounding the photodiode region 203, gate electrode 204 and drain region 205 in a plan view. The thickness of a gate oxide film 207, which is located directly below the gate electrode 204, is 10 nm or less. A portion on one end of the gate electrode 204 overlaps the photodiode region 203.

In addition, a first region 211, a second region 212, and a third region 213 are formed in this order on the surface side of the substrate from the photodiode region 203 to the drain region 205 via the channel region below the gate electrode 204. The first region 211 is disposed with a predetermined distance from one end of the gate electrode 204 and has a P type first concentration C1. The second region 212 has a P type second concentration C2 and one end thereof is adjacent to the first region 211 and the other end overlaps the gate electrode 204. The third region 213 has a P type third concentration C3 and one end thereof is adjacent to the second region 212 and the other end is adjacent to the drain region 205. The relationship among the concentrations C1 to C3 herein is as follows: first concentration C1>second concentration C2>third concentration C3; or first concentration C1=second concentration C2>third concentration C3. As such, it becomes possible to obtain the MOS type solid-state image capturing element 200 in which the reading characteristics becomes favorable at a low voltage, and white spots, dark current and other image defects are suppressed sufficiently.

In a solid-state image capturing element and a method for driving the solid-state image capturing element disclosed in Reference 3, it is proposed that a negative voltage of −0.5 V or less (e.g., −1 V) is applied to a transfer gate electrode during the accumulation of electric charges, so that a hole channel is formed in an interface of an oxide film directly below the transfer gate electrode to reduce dark noise (dark voltage and white detects).

Reference 1: Japanese Laid-Open Publication No. 2008-66480

Reference 2: Japanese Laid-Open Publication No. 2005-123395

Reference 3: Japanese Patent No. 3724374

SUMMARY

In the above-described conventional technique disclosed in Reference 1, however, the p-type well region 102C is not formed in the overlapping region (distance b) of the n-type, photoelectric conversion and accumulation section 103B and the transfer gate 106, as illustrated in FIG. 11(a). Thus, noise electric charges are produced at an interface level of a silicon/silicon oxide film (insulation film 105) in the overlapping region, and the noise electric charges are accumulated towards the photoelectric conversion and accumulation section 103B, causing white detects.

Further, in the above-described conventional technique disclosed in Reference 2, as illustrated in FIG. 12, mask alignment is required entirely for the positioning of the first region 211 and the second region 212 as well as the positioning of the second region 212 and the third region 213. The positioning involves a problem of difficulty and increasing of the degree of variation in the manufacturing process.

Moreover, in the above-described conventional technique disclosed in Reference 3, a large electric potential difference of −0.5 V or less is required as a negative voltage applied to the transfer gate electrode, which causes a problem of increased complication in the circuit configuration. That is, a large voltage value of −0.5 V or less is necessary as the applied voltage to suppress noise at a dark time (dark voltage and white defects), and a negative voltage needs to be applied to the transfer gate electrode. This causes a problem of increased complication in the circuit configuration, such as adding a negative voltage generating circuit in a peripheral circuit region and adding a buffer circuit with a different well electric potential (the well electric potential is also required to be a negative electric potential including 0 V) in order to apply a negative voltage in a pixel driving circuit section.

The technology presented herein is intended to solve the conventional problems described above. The present technology provides a solid-state image capturing element capable of transferring signal charges completely from a photoelectric conversion and accumulation section to an electric charge detecting section under low voltage driving to obtain high quality images further suppressing noise and after images, facilitating the processes with a more simple configuration to greatly suppress white defects, and avoiding increased complication in the circuit configuration; a method for driving the solid-state image capturing element; a method for manufacturing the solid-state image capturing element; and an electronic information device, such as a camera-equipped cell phone device, including the solid-state image capturing element as an image input device used in an image capturing section thereof.

A solid-state image capturing element according to the present technology includes, as a unit pixel section disposed in a semiconductor substrate: a photodiode region including a first conductivity type semiconductor region constituting a photoelectric conversion and accumulation section for photoelectrically converting light into signal charges for electric charge accumulation, and a second conductivity type semiconductor pinning layer for separating the photoelectric conversion and accumulation section from a surface of the semiconductor substrate; a gate electrode one end of which is adjacent to the second conductivity type semiconductor pinning layer, wherein one end portion of the gate electrode overlaps one end portion of the photoelectric conversion and accumulation section; and an electric charge detecting section as a first conductivity type drain region adjacent to the other end of the transfer gate electrode, the solid-state image capturing element further including, disposed in a surface portion from an upper part of the photodiode region to the electric charge detecting section: a second conductivity type first region as the second conductivity type semiconductor pinning layer; a second conductivity type second region, one end of which is adjacent to the second conductivity type first region and which is disposed in an overlapping region of the photoelectric conversion and accumulation section; and a second conductivity type third region, one end of which is adjacent to the second conductivity type second region and the other end of which is adjacent to the electric charge detecting section, where each impurity concentration of the first, second and third regions is set in a manner to form an electric field being directed from the second conductivity type first region through the second conductivity type second region to the second conductivity type third region, thereby achieving the objective described above.

Preferably, in a solid-state image capturing element according to the present invention technology, a relationship among an impurity concentration C1 of the second conductivity type first region, an impurity concentration C2 of the second conductivity type second region, and an impurity concentration C3 of the second conductivity type third region is set to be C1 >C2>C3.

Still preferably, in a solid-state image capturing element according to the present technology, the impurity concentration C1 of the second conductivity type first region is set to be $8 \times 10^{17}$ cm$^{-3}$ to $3 \times 10^{18}$ cm$^{-3}$, the impurity concentration C2 of the second conductivity type second region is set to be $9 \times 10^{16}$ cm$^{-3}$ to $5 \times 10^{17}$ cm$^{-3}$, and the impurity concentration C3 of the second conductivity type third region is set to be $3 \times 10^{16}$ cm$^{-3}$ to $1 \times 10^{17}$ cm$^{-3}$.

Still preferably, in a solid-state image capturing element according to the present technology, a relationship among a depth D1 of the second conductivity type first region from a substrate surface, a depth D2 of the second conductivity type second region from the substrate surface, and a depth D3 of the second conductivity type third region from the substrate surface is D3>D1>D2.

Still preferably, in a solid-state image capturing element according to the present technology, the first conductivity type semiconductor region is completely buried inside the semiconductor substrate, in a state surrounded by the second conductivity type semiconductor pinning layer thereabove, the gate electrode adjacent to one end of the second conductivity type semiconductor pinning layer, a second conductivity type region adjacent to and extending below the other end portion of the second conductivity type semiconductor pinning layer, and a buried second conductivity type region adjacently below the second conductivity type region and disposed below the first conductivity type semiconductor region.

Still preferably, in a solid-state image capturing element according to the present technology, the second conductivity type second region is adjacent to the second conductivity type first region and disposed on the overlapping region of the photoelectric conversion and accumulation section below the gate electrode.

Still preferably, in a solid-state image capturing element according to the present technology, a boundary between the second conductivity type first region and the second conductivity type second region lines up with one end of the gate electrode vertically, and a boundary between the second conductivity type second region and the second conductivity type third region lines up with one end of the photoelectric conversion and accumulation section vertically.

Still preferably, in a solid-state image capturing element according to the present technology, the second conductivity type region surrounds a region from the first conductivity type semiconductor region to the second conductivity type second region, the second conductivity type third region, and even the electric charge detecting section.

Still preferably, in a solid-state image capturing element according to the present technology, the second conductivity type third region is adjacent to the first conductivity type semiconductor region and the second conductivity second region.

Still preferably, in a solid-state image capturing element according to the present technology, a positive electric potential difference of less than +0.5 V is applied in between the transfer gate electrode and the second conductivity type semiconductor region during a period when the photoelectric conversion and accumulation section photoelectrically converts light into signal charges for electric charge accumulation.

Still preferably, in a solid-state image capturing element according to the present technology, the positive electric potential difference is in the range equal to or greater than +0.2 V and less than +0.5 V.

A method for driving the solid-state image capturing element according to the present technology is a method for driving the above-described solid-state image capturing element according to the present technology, where a positive electric potential difference of less than +0.5 V is applied in between the gate electrode and the second conductivity type semiconductor region during a period when the photoelectric conversion and accumulation section photoelectrically converts light into signal charges for electric charge accumulation, thereby achieving the objective described above.

Preferably, in a method for driving the solid-state image capturing element according to the present technology, an electric potential of the gate electrode is fixed to be a grounding potential of a peripheral circuit section out of a pixel region, and a positive voltage of less than +0.5 V is applied to the second conductivity type region of the pixel region.

Still preferably, in a method for driving the solid-state image capturing element according to the present technology, the gate electrode is applied with a negative voltage of less than +0.5 V generated in a peripheral circuit section out of a pixel region, and an electric potential of the second conductivity type region in the pixel region is fixed to be a grounding potential of the peripheral circuit section out of the pixel region.

Still preferably, in a method for driving the solid-state image capturing element according to the present technology, the positive electric potential difference is in the range equal to or greater than +0.2 V and less than +0.5 V.

A method for manufacturing the solid-state image capturing element according to the present technology is a method for manufacturing the above-described solid-state image capturing element according to the present invention, the method including: a second conductivity type second region forming step of forming the photoelectric conversion and accumulation section and subsequently forming a region to be the second conductivity type second region with the second conductivity type first region by another ion implantation, using an identical mask; a second conductivity type second and third region forming step of performing ion implantation in regions to be the photodiode region, the transfer gate region below the gate electrode, and the first conductivity type drain region, using a mask having an opening, to form the second conductivity type second region and the second conductivity type third region, prior to formation of the gate electrode; and a second conductivity type first region forming step of performing ion implantation on the photodiode region, using a mask having an opening and including the gate electrode, to form the second conductivity type first region, after formation of the gate electrode, thereby achieving the objective described above.

Preferably, in a method for manufacturing the solid-state image capturing element according to the present technology, a relationship among an impurity concentration C1 of the second conductivity type first region, an impurity concentration C2 of the second conductivity type second region, and an impurity concentration C3 of the second conductivity type third region is set to be C1>C2>C3.

Still preferably, in a method for manufacturing the solid-state image capturing element according to the present technology, the impurity concentration C1 of the second conductivity type first region is set to be $8\times10^{17}$ cm$^{-3}$ to $3\times10^{18}$ cm$^{-3}$, the impurity concentration C2 of the second conductivity type second region is set to be $9\times10^{16}$ cm$^{-3}$ to $5\times10^{17}$ cm$^{-3}$, and the impurity concentration C3 of the second conductivity type third region is set to be $3\times10^{16}$ cm$^{-3}$ to $1\times10^{17}$ cm$^{-3}$.

Still preferably, in a method for manufacturing the solid-state image capturing element according to the present technology, a relationship among a depth D1 of the second conductivity type first region from a substrate surface, a depth D2 of the second conductivity type second region from the substrate surface, and a depth D3 of the second conductivity type third region from the substrate surface is D3>D1>D2.

Still preferably, in a method for manufacturing the solid-state image capturing element according to the present technology, the first conductivity type semiconductor region is completely buried inside the semiconductor substrate, in a state surrounded by the second conductivity type semiconductor pinning layer thereabove, the gate electrode adjacent to one end of the second conductivity type semiconductor pinning layer, a second conductivity type region adjacent to and extending below the other end portion of the second conductivity type semiconductor pinning layer, and a buried second conductivity type region adjacently below the second conductivity type region and disposed below the first conductivity type semiconductor region.

Still preferably, in a method for manufacturing the solid-state image capturing element according to the present technology, the second conductivity type second region is adjacent to the second conductivity type first region and formed on the overlapping region of the photoelectric conversion and accumulation section below the gate electrode.

Still preferably, in a method for manufacturing the solid-state image capturing element according to the present technology, the second conductivity type first region, the second conductivity type second region and the second conductivity type third region are formed by using an identical mask by varying and overlapping an opening-region of the mask for ion implantation.

Still preferably, in a method for manufacturing the solid-state image capturing element according to the present technology, a boundary between the second conductivity type first region and the second conductivity type second region lines up with one end of the gate electrode vertically, and a boundary between the second conductivity type second region and the second conductivity type third region lines up with one end of the photoelectric conversion and accumulation section vertically.

Still preferably, in a method for manufacturing the solid-state image capturing element according to the present technology, the second conductivity type region surrounds a region from the first conductivity type semiconductor region to the second conductivity type second region, the second conductivity type third region, and even the electric charge detecting section.

Still preferably, in a method for manufacturing the solid-state image capturing element according to the present technology, the second conductivity type third region is adjacent to the first conductivity type semiconductor region and the second conductivity second region.

An electronic information device according to the present invention includes a solid-state image capturing element according to the present technology as an image input device used in an image capturing section thereof, thereby achieving the objective described above.

The functions of the present technology having the structure described above will be described hereinafter.

In the present technology, the second conductivity type first region, the second conductivity type second region and the second conductivity type third region are disposed in the surface portion from the upper part of the photodiode region to the electric charge detecting section. The second conductivity type first region is a second conductivity type semiconductor pinning layer. The second conductivity type second region includes one end adjacent to the second conductivity type first region and is disposed on the overlapping region of the photoelectric conversion and accumulation section. The second conductivity type third region includes one end adjacent to the second conductivity type second region and the other end adjacent to the electric charge detecting section. Each impurity concentration in the regions is set such that an electric field is formed from the second conductivity type first region to the second conductivity type third region via the second conductivity type second region.

A portable electronic information device is driven by batteries and it is important to achieve the lowering of the voltage of the driving electricity and the lowering of the electric power consumption. Owing to the above structure, such a portable electronic information device becomes capable of transferring signal charges completely from the photoelectric conversion and accumulation section to the electric charge detecting section under low voltage driving, thereby obtaining high quality images further suppressing noise and after images and greatly suppressing white defects.

Further, in the present technology, an identical mask is used and an opening region of the mask is varied and overlapped for ion implantation, so that the boundary between the second conductivity type first region and the second conductivity type second region lines up with one end of the gate electrode vertically, and the boundary between the second conductivity type second region and the second conductivity type third region lines up with one end of the photoelectric conversion and accumulation section vertically.

As a result, with the more simple structure, the manufacturing processes are facilitated for the solid-state image capturing element, thereby greatly suppressing white defects.

Further, by applying a positive electrode potential difference of less than +0.5 between the gate electrode and the second conductivity type semiconductor region directly therebelow, a hole concentration increases in a p-region at a silicon/silicon oxide film interface and trapping efficiency of noise electrons by holes increases, thereby further reducing the amount of white defects and achieving the improvement on the image quality.

According to the present technology with the structure described above, it becomes possible to transfer signal charges completely from the photoelectric conversion and accumulation section to the electric charge detecting section under low voltage driving to obtain high quality images further suppressing noise and after images, and greatly suppress white detects.

Further, an identical mask is used and an opening region of the mask is varied and overlapped for ion implantation, so that a more simple structure can facilitate the manufacturing process and white defects can be greatly suppressed.

Still further, by applying a positive electrode potential difference of less than +0.5 between the gate electrode and the second conductivity type semiconductor region directly therebelow, a hole concentration increases in a p-region at a silicon/silicon oxide film interface and trapping efficiency of noise electrons by the holes increases, thereby further reducing the amount of white defects and achieving the improvement on the image quality.

These and other advantages of the technology presented herein will become apparent to those skilled in the art upon reading and understanding the following detailed description with reference to the accompanying figures.

BRIEF DESCRIPTION OF THE DRAWINGS

FIG. 9(b) is a potential distribution diagram in a case where a transfer pulse $\phi_{TX}$ applied to a transfer gate electrode is at a low level, FIG. 9(c) is a potential distribution diagram in a case where the transfer pulse $\phi_{TX}$ applied to a transfer gate electrode is at a high level.

FIG. 10(a) is a longitudinal cross sectional view of another conventional MOS type solid-state image capturing element disclosed as a conventional example in Reference 1, illustrating the solid-state image capturing element for one pixel. FIGS. 10(b) and 10(c) are each a potential distribution diagram illustrating a transferring path for signal charges, which consists of a photoelectric conversion and accumulation section, a channel region below a transfer gate electrode, and an electric charge detecting section and is taken along the dotted line a-a' in FIG. 10(a) FIG. 10(b) is a potential distribution diagram in a case where a transfer pulse $\phi_{TX}$ applied to a transfer gate electrode is at a low level. FIG. 10(c) is a potential distribution diagram in a case where the transfer pulse $\phi_{TX}$ applied to a transfer gate electrode is at a high level.

FIG. 11(b) is a potential distribution diagram in a case where a transfer pulse $\phi_{TX}$ applied to a transfer gate electrode is at a low level. FIG. 11(c) is a potential distribution diagram in a case where the transfer pulse $\phi_{TX}$ applied to a transfer gate electrode is at a high level.

Figure 1:
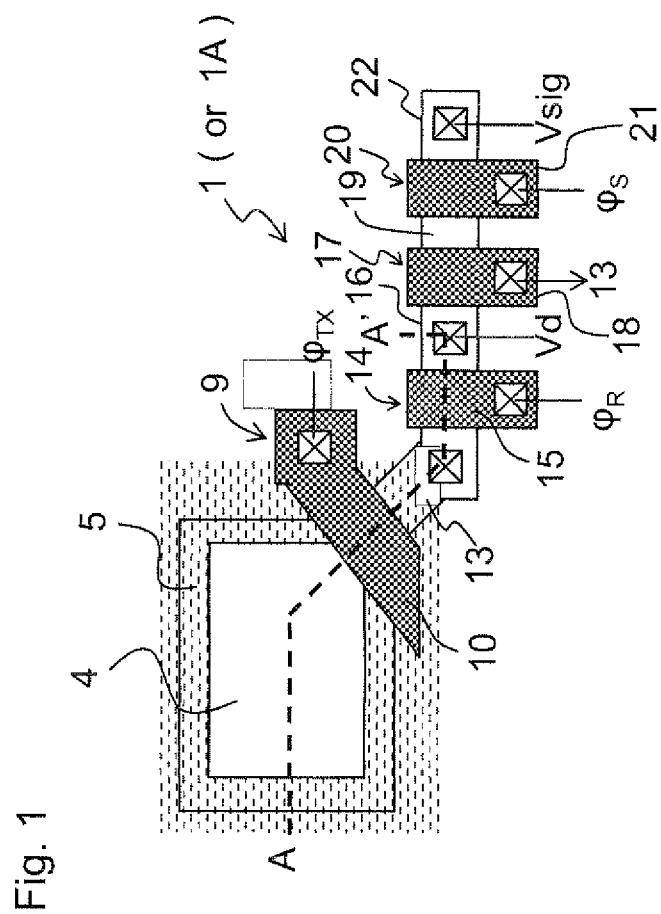
FIG. 1 is a plan view illustrating an exemplary essential part structure of a unit pixel section of a MOS type solid-state image capturing element according to Embodiment 1.

1 MOS type solid-state image capturing element
2 n-type semiconductor substrate
3 buried p-type semiconductor layer
4 photoelectric conversion and accumulation section (light receiving section)
5 p-type well region
6 element separating region
7 surface p+ pinning layer
8 insulation film
9 transferring transistor
10 transfer gate electrode
11 surface p-region
12 surface p-region
13 electric charge detecting section (drain region; floating diffusion FD)
14 reset transistor
15 reset gate electrode
16, 19, 22 impurity diffusion region
17 amplifying transistor
18 amplifying gate electrode
20 selecting transistor
21 selecting gate electrode
41 buried photodiode
Vsig signal line
C1 concentration in a surface p+ pinning layer
C2 concentration in a surface p-region on an overlapping region
C3 concentration in a surface p-region under a transfer gate electrode
90 electronic information device
91 solid-state image capturing apparatus
92 memory section
93 display section
94 communication section
95 image output section

DESCRIPTION OF THE PREFERRED EMBODIMENTS

Hereinafter, Embodiments 1 and 2 will be described where the solid-state image capturing element according to the present technology is applied to a MOS type solid-state image capturing element, and Embodiment 3 will be described where the solid-state image capturing element according to the present technology is applied to an electronic information device, such as a camera-equipped cell phone device, including the solid-state image capturing element as an image input device used in an image capturing section thereof, with reference to the accompanying figures.

Embodiment 1

Figure 2:
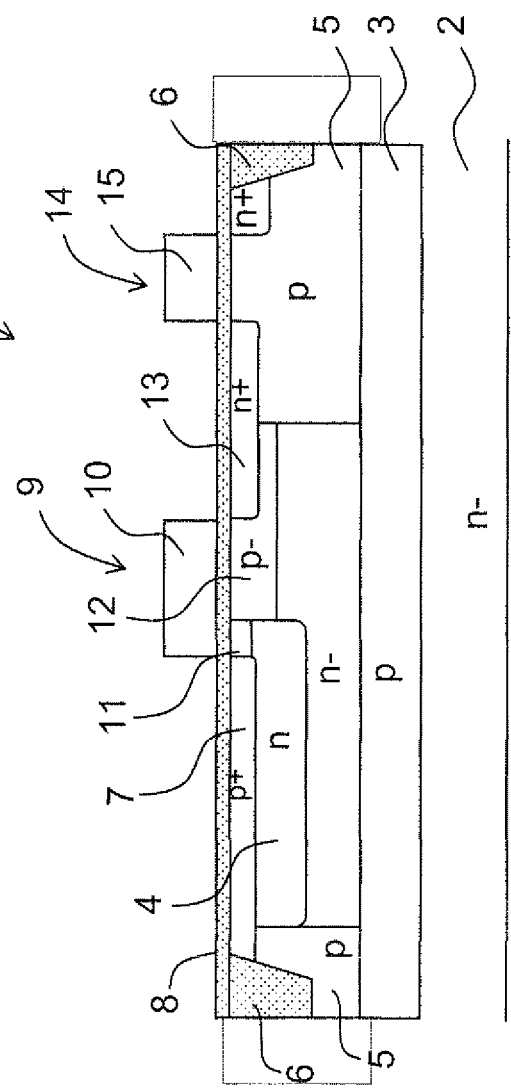
FIG. 2 is a longitudinal cross sectional view taken along a dotted line A-A' in FIG. 1.

FIG. 1 is a plan view illustrating an exemplary essential part structure of a unit pixel section of a MOS type solid-state image capturing element according to Embodiment 1. FIG. 2 is a longitudinal cross sectional view taken along a dotted line A-A' in FIG. 1. In the following description, it should be noted that an explanation will be provided with regard to a structure of one unit pixel section, but other unit pixel sections have a similar structure among the plurality of pixel sections.

In FIGS. 1 and 2, a MOS type solid-state image capturing element 1 according to Embodiment 1 includes a buried p-type semiconductor layer 3. The buried p-type semiconductor layer 3 is provided for each unit pixel section and is disposed at a predetermined depth in an n-type (low concentration n type: n-) semiconductor substrate 2, and for example, about 2 µm from the surface of the semiconductor substrate. An n-type semiconductor region, which constitutes a photoelectric conversion and accumulation section 4, is provided in the photodiode formed towards the surface of the semiconductor substrate closer than the buried p-type semiconductor layer 3. The photoelectric conversion and accumulation section 4, which constitutes the photodiode, and the n-region of the n-type semiconductor substrate therebelow are separated from each other horizontally by the buried p-type semiconductor layer 3.

The photoelectric conversion and accumulation section 4 includes a photoelectric conversion section and an electric charge accumulation section formed integrally. The photoelectric conversion and accumulation section 4 covers a rectangular or square light receiving section entirely in a plan view. A p-type well region 5 is formed in such a manner to surround the periphery of the photoelectric conversion and accumulation section 4. The photoelectric conversion and accumulation section 4 is separated from an element separating region 6 by the p-type well region 5. The element separating region 6 is provided to separate unit pixel sections per element. The element separating region 6 is formed by burying an insulating material inside a trench provided by etching or the like in the surface of the semiconductor substrate 2.

Further, a high concentration p-type (surface p+) pinning layer 7 is provided as a second conductivity type semiconductor pinning layer (second conductivity type first region) on the photoelectric conversion and accumulation section 4 in the surface side of the n-type semiconductor substrate 2. The photoelectric conversion and accumulation section 4 and the surface of the n-type semiconductor substrate 2 are separated from each other by the surface p+ pinning layer 7. The surface p+ pinning layer 7 is electrically connected to the buried p-type semiconductor layer 3 with the p-type well region 5 interposed therebetween. The photoelectric conversion and accumulation section 4 constituting the photodiode is buried inside the semiconductor substrate while being surrounded by the surface p+ pinning layer 7 thereabove, the p-type well region 5 in the periphery, and the buried p-type semiconductor layer 3 therebelow. As a result, the buried photodiode is configured as previously described. In summary, the front surface side of the photoelectric conversion and accumulation section 4 is completely covered by the surface p+ pinning layer 7 and the transfer gate electrode 10 of a transferring transistor 9, thereby achieving the lowering of noise. Herein, the impurity concentration of the surface p+ pinning layer 7 is set to be a high concentration, for example, about $1\times10^{18}$ cm$^{-3}$ (and for example, $8\times10^{17}$ cm$^{-3}$ to $3\times10^{18}$ cm$^{-3}$).

In this case, the surface p+ pinning layer 7 is adjacent to one of the end surfaces of the transfer gate electrode 10 with an insulation film 8 interposed therebetween. An electric charge detecting section 13 is adjacent to the other end surface of the transfer gate electrode 10 as a drain region with the insulation film 8 interposed therebetween. On the substrate between the surface p+ pinning layer 7 and the electric charge detecting section 13, the transfer gate electrode 10 of the transferring transistor 9 is formed with the insulation film 8 formed of a silicon oxide film interposed therebetween. In a plan view, the p-type well region 5 surrounds the regions ranging from the photoelectric conversion and accumulation section 4 to the electric charge detecting section 13 with a gate channel region below the transfer gate electrode 10 interposed therebetween.

A surface p-region 11 as the second conductivity type second region is disposed adjacent to the surface p+ pinning layer 7 of the photodiode surface along the substrate surface, below the transfer gate electrode 10, and in an overlapping region of the transfer gate electrode 10 and the photoelectric conversion and accumulation section 4 in a plan view. Further, below the transfer gate electrode 10, a surface p-region 12 is disposed as the second conductivity type third region adjacent to the surface p-region 11. The surface p-region (p-well region) 12 below the transfer gate electrode 10 constitutes a channel region (transfer gate region) of the transferring transistor 9. The electric charge detecting section 13 of the n-type semiconductor region is formed on the opposite side of the photoelectric conversion and accumulation section 4 of the transfer gate electrode 10 and on the substrate surface side above the surface p-region 12 and the p-type well region 5. In the meantime, the n-low concentration semiconductor region (illustrated without a reference numeral) of the n-type (low concentration n type: n-) semiconductor substrate 2 remains between the photoelectric conversion and accumulation section 4, surface p-region 12 and the buried p-type semiconductor layer 3.

As described above, the surface pinning layer 7 in the surface of the photodiode and the p well region 11 cover the photoelectric conversion and accumulation section 4, and the p well region 12 is formed in a silicon surface portion linked together from the surface of the photodiode to the transfer gate region. Impurity concentrations are set in such a manner to form an electric field from the surface p+ pinning layer 7 in the surface of the photodiode to the surface p-region 11 on the surface of the overlapping region below the transfer gate electrode 10, and further, from the surface p-region 11 on the surface of the overlapping region through the surface p-region 12 to the electric charge detecting section 13 (floating diffusion FD), which is a drain region of the transferring transistor 9.

As illustrated in FIG. 1, the electric charge detecting section 13 is a floating diffusion FD, and is connected to an impurity diffusion region 16 with a channel region below a reset gate electrode 15 of a reset transistor 14 interposed therebetween. The impurity diffusion region 16 is connected to an impurity diffusion region 19 with a channel region below a gate electrode 18 of an amplifying transistor 17 interposed therebetween. Further, the impurity diffusion region 19 is connected to an impurity diffusion region 22 with a channel region below a gate electrode 21 of a selecting transistor 20 interposed therebetween. The electric charge detecting section 13 (floating diffusion FD) is electrically connected to the gate electrode 18 of an amplifying transistor 17, via contacts and upper wiring connected to the gate electrode 18. The impurity diffusion region 22 is connected to a signal line Vsig.

The impurity concentration of the p-type well region, which constitutes each channel region of the reset transistor 14, amplifying transistor 17 and selecting transistor 20 in the circuit section in a pixel, is set within the range of, for example, $2 \times 10^{17}$ cm$^{-3}$ ± $1 \times 10^{17}$ cm$^{-3}$ ($2 \times 10^{17}$ cm$^{-3}$, herein). The impurity concentration of the surface p-region 12, which constitutes the channel region of the transferring transistor 9, is set within the range of, for example, $3 \times 10^{16}$ cm$^{-3}$ to $1 \times 10^{17}$ cm$^{-3}$ ($7.5 \times 10^{16}$ cm$^{-3}$, as an optimum value herein), Further, the impurity concentration of the surface p-region 11, which is the overlapping region of the photoelectric conversion and accumulation section 4 and is formed on the overlapping region with the transfer gate electrode 10, is set within the range of, for example, $9 \times 10^{16}$ cm$^{-3}$ to $5 \times 10^{17}$ cm$^{-3}$ ($2.25 \times 10^{17}$ cm$^{-3}$, as an optimum value herein) as three times the impurity concentration of the p-type well region 12.

Further, the impurity concentration of the n-type semiconductor substrate 2 is set within the range of, for example, $1 \times 10^{14}$ cm$^{-3}$ to $1 \times 10^{15}$ cm$^{-3}$ ($1 \times 10^{15}$ cm$^{-3}$, herein). The impurity concentration of the buried p-type semiconductor layer 3 is set within the range of, for example, $7 \times 10^{15}$ cm$^{-3}$ to $2 \times 10^{17}$ cm$^{-3}$ ($8 \times 10^{16}$ cm$^{-3}$, herein). The impurity concentration of the n-type semiconductor region in the photoelectric conversion and accumulation section 4 is set within the range of, for example, $1 \times 10^{17}$ cm$^{-3}$ to $4 \times 10^{17}$ cm$^{-3}$ ($2 \times 10^{17}$ cm$^{-3}$, herein). The impurity concentration of the p-type well region 5 in the periphery thereof is set within the range of, for example, $2 \times 10^{17}$ cm$^{-3}$ ± $1 \times 10^{17}$ cm$^{-3}$ ($2 \times 10^{17}$ cm$^{-3}$, herein). Note that the impurity concentration of the p-type well region 5 is set to be the same concentration of the reset transistor 14, amplifying transistor 17 and other p-type wells in the circuit section in a pixel.

Figure 3:
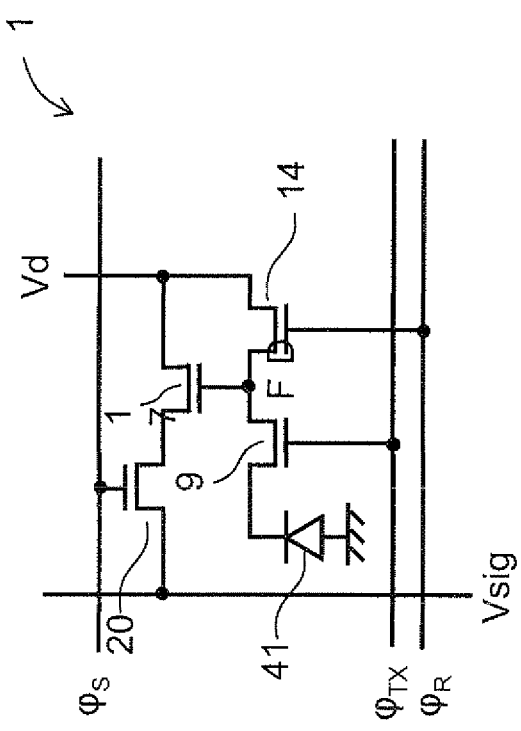
FIG. 3 is a circuit diagram of a data reading circuit for one pixel in the MOS type solid-state image capturing element of FIG. 1.

FIG. 3 is a circuit diagram of a data reading circuit for one pixel in the MOS type solid-state image capturing element 1 of FIG. 1. Herein, a plurality of unit pixel sections as this are arranged in a two dimensional matrix.

As a unit pixel section illustrated in FIG. 3, the MOS type solid-state image capturing element 1 according to Embodiment 1 includes: a buried photodiode 41 (photoelectric conversion and accumulation section 4 and surface p+ pinning layer 7) functioning as a photoelectric conversion element for photoelectrically converting light into signal charges to be accumulated; a transferring transistor 9; a reset transistor 14 constituting a circuit section in a pixel (data reading circuit); an amplifying transistor 17 constituting a circuit section in a pixel (data reading circuit); a pixel selecting transistor 20 constituting the circuit section in the pixel (data reading circuit); a signal line Vsig connected to an output end of the pixel selecting transistor 20; a transfer signal line connected with a control gate (transfer gate electrode 10) of the transferring transistor 9 and inputted with a transfer pulse $\phi_{TX}$; a reset signal line connected with a control gate (reset gate electrode 15) of the reset transistor 14 and inputted with a reset pulse $\phi_R$; and a pixel selection signal line connected with a control gate (reset gate electrode 21) of the pixel selecting transistor 20 and inputted with a selection pulse $\phi_S$.

Hereinafter, a method for manufacturing the MOS type solid-state image capturing element 1 according to Embodiment 1 will be described.

Figure 4:
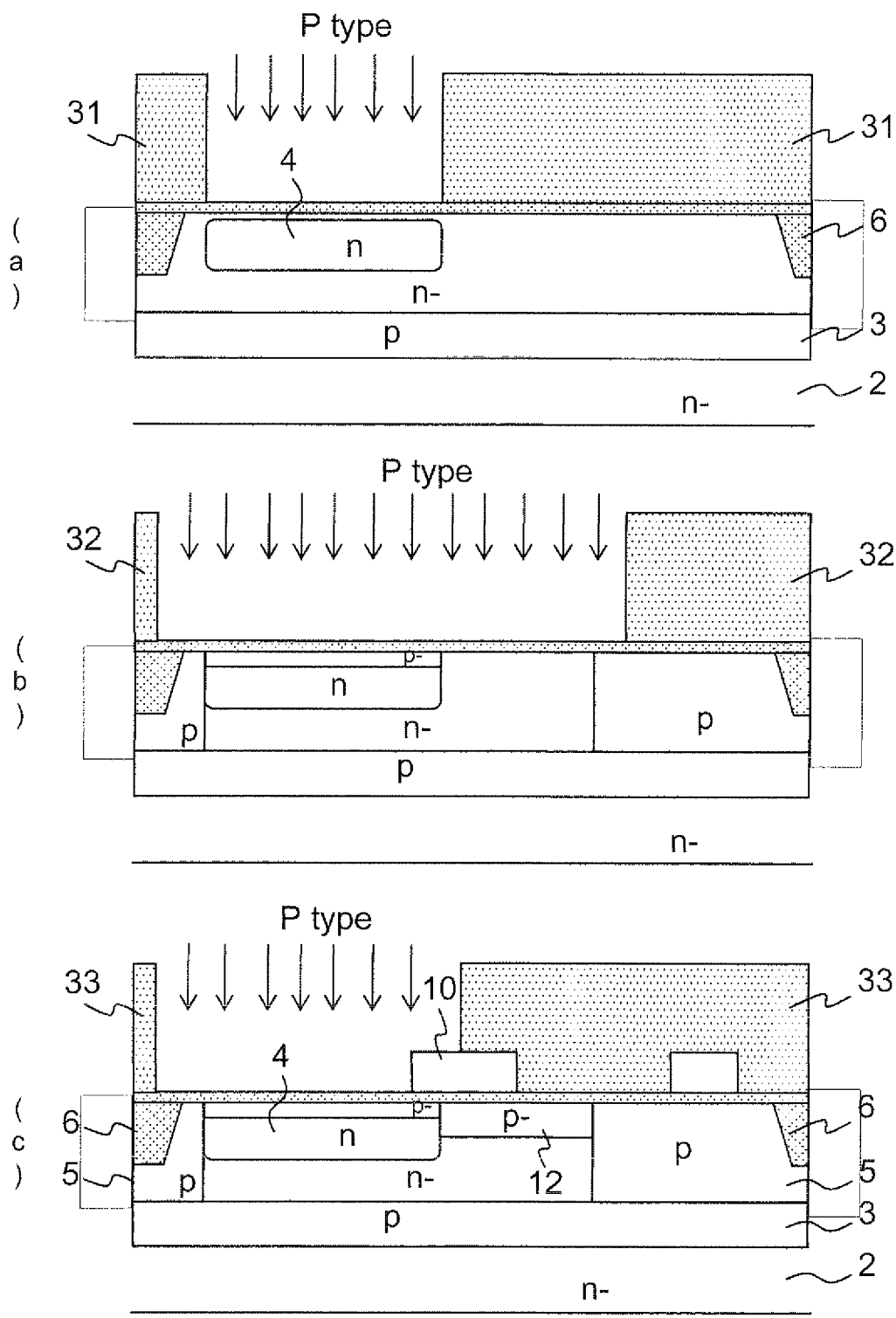
FIGS. 4(a) to 4(c) are each an essential part longitudinal cross sectional view illustrating each manufacturing step in a method for manufacturing the MOS type solid-state image capturing element in FIG. 1.

FIGS. 4(a) to 4(c) are each an essential section longitudinal cross sectional view illustrating respective manufacturing steps in the method for manufacturing the MOS type solid-state image capturing element 1 in FIG. 1.

First, as illustrated in FIG. 4(a), in a step of forming a surface p-region on the overlapping region, n-type ions are implanted using a photomask 31 as a mask to form the n-type photoelectric conversion and accumulation section 4. Further, p-type ions are implanted using the same photomask 31 as a mask to form a region, which will be the surface p-region 11 on the overlapping region of the photoelectric conversion and accumulation section 4 with the transfer gate electrode 10. As a result, using the same photomask 31, the positioning becomes facilitated and accurate between the n-type photoelectric conversion and accumulation section 4 and the p-type, surface p-region 11 thereabove.

Next, as illustrated in FIG. 4(b), in a step of forming a surface p-region in a transfer gate region, p-type ions are implanted in the electric charge detecting section 13 of a photodiode region, a transfer gate region and the electric charge detecting section 13 of a drain region, using a photomask 32 having an opening as a mask, prior to the formation of the transfer gate electrode 10, so that the surface p-region 12 is formed, which functions as a transfer gate region. As a result, the positioning becomes facilitated and accurate between the surface p-region 11 and the surface p-region 12.

Subsequently, as illustrated in FIG. 4(c), in a step of forming a surface p+ pinning layer on the photoelectric conversion and accumulation section 4, p-type, high concentration ions are implanted using the transfer gate electrode 10 and a photomask 33 as masks after the formation of the transfer gate electrode 10, so that the high concentration, surface p+ pinning layer 7 is formed on the photodiode surface. By self-alignment of the transfer gate electrode 10, the positioning becomes facilitated and accurate between the surface p+ pinning layer 7 and the surface p-region 11.

As described above, in addition to the surface p+ pinning layer 7 on the photodiode surface and the surface p-region 12 on the substrate surface directly below the transfer gate electrode 10, in between the two, the surface p-region 11 is formed on the overlapping region of the photoelectric conversion and accumulation section 4, and the surface p-regions 11 and 12 are formed in this order in the silicon substrate surface linked from the photodiode surface to the transfer gate region.

In this case, respective ends of the photoelectric conversion and accumulation section 4 and the surface p-region 11 line up with each other vertically. The boundary of the surface p-regions 11 and 12 lines up with one end of the photoelectric conversion and accumulation section 4 vertically. The boundary of the surface p+ pinning layer 7 and the surface p-region 11 lines up with one end of the transfer gate electrode 10 vertically. Further, the boundary of the surface p-region 12 and the electric charge detecting section 13 line up with the other end of the transfer gate electrode 10.

As a result, noise electrons, which are generated at an interface of a silicon/silicon oxide film (surface of the silicon substrate below the transfer gate electrode 10), are trapped in the holes existing in the surface p-regions 11 and 12. In addition, the relationship is set among a concentration C1 of the surface p+ pinning layer 7 as the second conductivity type first region on the surface of the photodiode region, a concentration C2 of the surface p-region 11 as the second conductivity type second region on the overlapping region, and a concentration C3 of the surface p-region 12 as the second conductivity type third region below the transfer gate electrode 10, to be concentration C1>concentration C2>concentration C3 by the manufacturing method illustrated in FIGS. 4(a) to 4(c). Thus, the electric field is formed being directed from the surface of the overlapping region of the photoelectric conversion and accumulation section 4 towards the electric charge detecting section 13 of the drain region. In addition, the relationship is set among a depth D1 of the surface p+ pinning layer 7 as the second conductivity type first region, a depth D2 of the surface p-region 11 as the second conductivity type second region, and a depth D3 of the surface p-region 12 as the second conductivity type third region, to be depth D3>depth D1>depth D2.

As a result, the noise electrons, which are generated at the interface of the silicon/silicon oxide film (surface of the silicon substrate below the transfer gate electrode 10), are moved and discharged towards the transfer gate region and the drain region, without being moved and accumulated towards the photodiode 41, which functions as a light receiving section.

Therefore, in the MOS type solid-state image capturing element 1 according to Embodiment 1, in addition to the surface p+ pinning layer 7 in the photodiode surface and the surface p-region 12 in the substrate surface below the transfer gate electrode 10, in between the two, the surface p-region 11 is formed on the overlapping region of the photoelectric conversion and accumulation section 4, so that the electric field is formed being directed from the surface p-region 11 on the surface of the overlapping region through the surface p-region 12 to the drain region. As a result, white defects can be greatly reduced as illustrated in FIG. 5.

Figure 5:
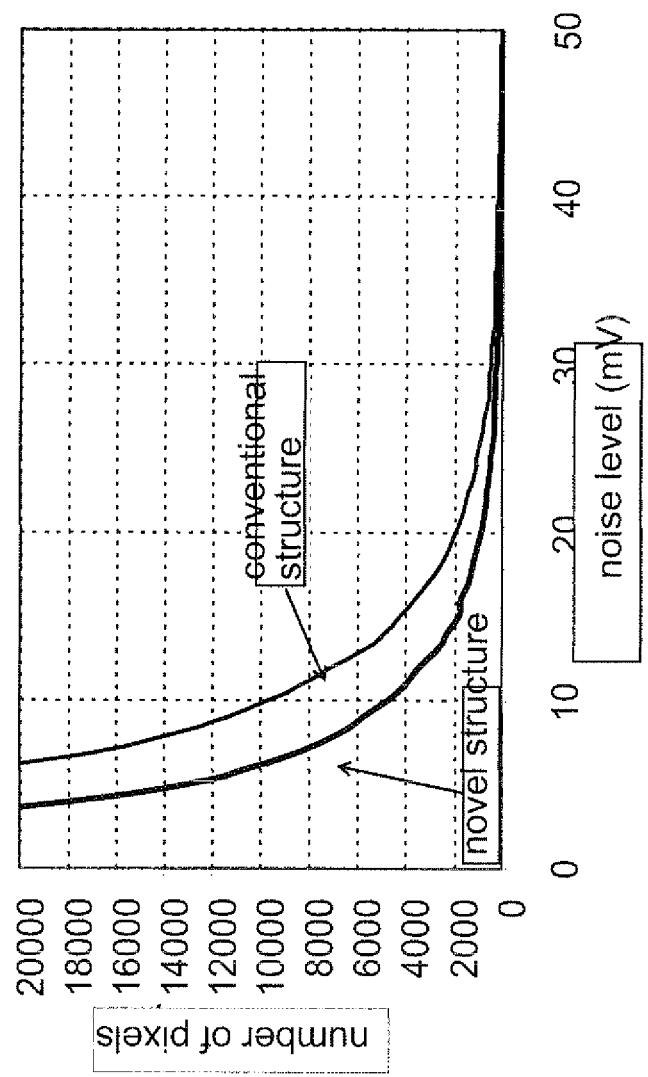
FIG. 5 is a graph describing a result of reducing white defects by Embodiment 1.
Figure 11:
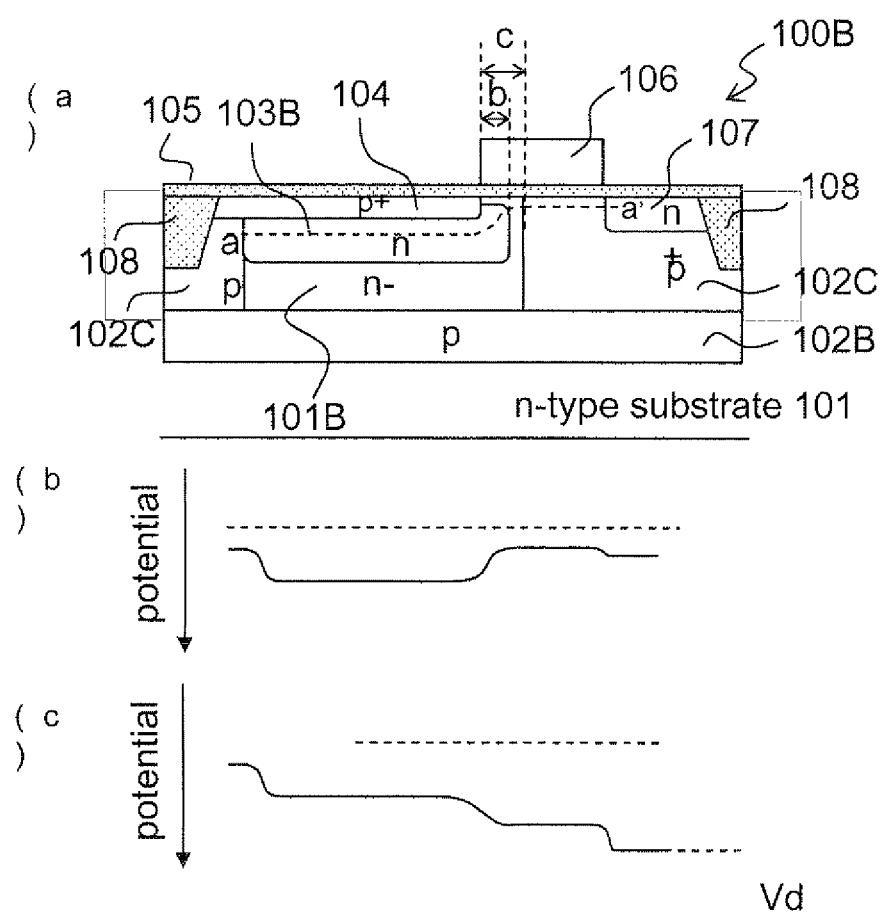
FIG. 11(a) is a cross sectional view of a transferring path for signal charges from a photodiode section to an electric charge detecting section via a transferring transistor in a conventional MOS type solid-state image capturing element disclosed in Reference 1 (in the case of 0≤b≤c).
FIGS. 11(b) and 11(c) are each a potential distribution diagram illustrating a transferring path for signal charges, which consists of a photoelectric conversion and accumulation section, a channel region below a transfer gate electrode, and an electric charge detecting section and is taken along the dotted line a-a' in FIG. 11(a).
Figure 12:
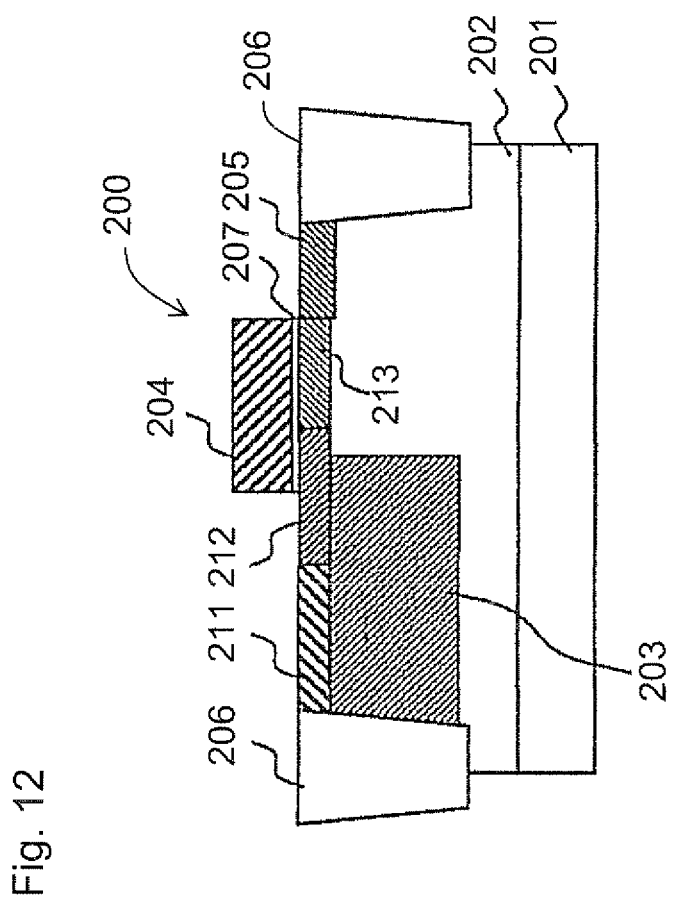
FIG. 12 is a longitudinal cross sectional view of a conventional MOS type solid-state image capturing element disclosed in Reference 2, illustrating the MOS type solid-state image capturing element for one pixel.

That is, in the comparison between the conventional structure (the MOS type image sensor 100B illustrated in FIG. 11(a)) and the novel structure (the MOS type image sensor 1 illustrated in FIGS. 1 and 2) as illustrated in FIG. 5, the number of pixels to be white defects are about four thousand in the novel structure at the noise level of 10 mV, while the number of pixels to be white defects are about ten thousand in the conventional structure at the noise level of 10 mV, This result tells that the number of white defects is greatly reduced in the novel structure. As a result, noise electrons, which are generated at an interface of a silicon/silicon oxide film (surface of the silicon substrate below the transfer gate electrode 10), are trapped in the holes existing in the surface p-regions 11 and 12. Alternatively, the noise electrons are discharged from the transfer gate region to the drain region. As a result, the number of white defects is greatly reduced and the image quality can be improved.

Embodiment 2

In Embodiment 2, a method for driving a MOS type solid-state image capturing element to further reduce while defects will be described.

In FIGS. 1 and 2, a MOS type solid-state image capturing element 1A according to Embodiment 2 has the same structure as the MOS type solid-state image capturing element 1 according to Embodiment 1. As a unit pixel section disposed on an n-type semiconductor substrate 2, the MOS type solid-state image capturing element 1A includes: a photodiode region consisting of a first conductivity type semiconductor region constituting a photoelectric conversion and accumulation section 4 for photoelectrically converting light into signal charges to be accumulated, and a surface p+ pinning layer 7 for separating the photoelectric conversion and accumulation section 4 and the surface of the n-type semiconductor substrate 2; a transfer gate electrode 10 one end of which is adjacent to the surface p+ pinning layer 7; and an electric charge detecting section 13 as a first conductivity type drain region adjacent to the other end of the transfer gate electrode 10. One end portion of the transfer gate electrode 10 overlaps one end portion of the photoelectric conversion and accumulation section 4. On a surface portion from the upper part of the photodiode region to electric charge detecting section 13, a second conductivity type first region, a second conductivity type second region and a second conductivity type third region are disposed. The second conductivity type first region is the surface p+ pinning layer 7. The second conductivity type second region is a surface p-region 11, one end of which is adjacent to the surface p+ pinning layer 7 and which is disposed on the overlapping region of the photoelectric conversion and accumulation section 4. The second conductivity type third region is a surface p-region 12, one end of which is adjacent to the surface p-region 11 and the other end of which is adjacent to the electric charge detecting section 13. Impurity concentrations are respectively set in such a manner to form an electric field being directed from the second conductivity type first region via the second conductivity type second region to the second conductivity type third region.

What makes the MOS type solid-state image capturing element 1A according to Embodiment 2 different from the MOS type solid-state image capturing element 1 according to Embodiment 1 is that a positive electric potential difference of less than +0.5 V is applied in between the transfer gate electrode 10 and the second conductivity type semiconductor region (surface p-regions 11, 12) during a period when the photoelectric conversion and accumulation section 4 performs a photoelectric conversion for the accumulation of electric charges. In the MOS type solid-state image capturing element 1 according to Embodiment 1, the electric potential difference is 0 V in between the transfer gate electrode 10 and the second conductivity type semiconductor region (surface p-regions 11, 12). That is, in the MOS type solid-state image capturing element 1A according to Embodiment 2, it becomes possible to suppress dark noise during the accumulation of electric charges, under a state where the electric potential difference of the second conductivity type semiconductor region (surface p-regions 11, 12) directly below the transfer gate electrode 10 is less than +0.5V. Accordingly, the electric potential difference required for the suppression of dark noise is less than +0.5 V and the voltage is smaller than that in the case of Reference 3 (negative voltage of 0.5 V or less; −1 V, for example). Thus, instead of a second conductivity type well electric potential, which is a ground potential, of a peripheral circuit region, a positive electric potential difference of less than +0.5 V is applied to a second conductivity type well of an independent pixel region, so that the method for driving the MOS type solid-state image capturing element 1A that suppresses dark noise can be achieved without any modification to the structure of the peripheral circuits.

More specifically, the MOS type solid-state image capturing element 1A illustrated in FIG. 2 uses an n-type semiconductor substrate. Therefore, p-type semiconductor well regions 3 and 5 in a pixel region as well as a p-type well region in a peripheral circuit region (not shown) are independently disposed, and it is easy to separate them electrically. As a result, it becomes possible to apply a positive voltage of less than +0.5 V to the surface p-regions 11 and 12 through the buried p-type semiconductor layer 3 and the p-type well region 5, under a condition where the same ground potential as that of the p-type well region in the peripheral circuit region (0 V) is applied to the transfer gate electrode 10 of the MOS type solid-state image capturing element 1A illustrated in FIG. 2 during the accumulation of electric charges. Owing to the electric potential difference between the transfer gate electrode 10 and the surface p-regions 11 and 12 caused thereby, holes are gathered towards the transfer gate electrode 10 of the surface p-regions 11 and 12 and the noise electrons generated at a silicon/silicon oxide film interface are trapped.

Figure 6:
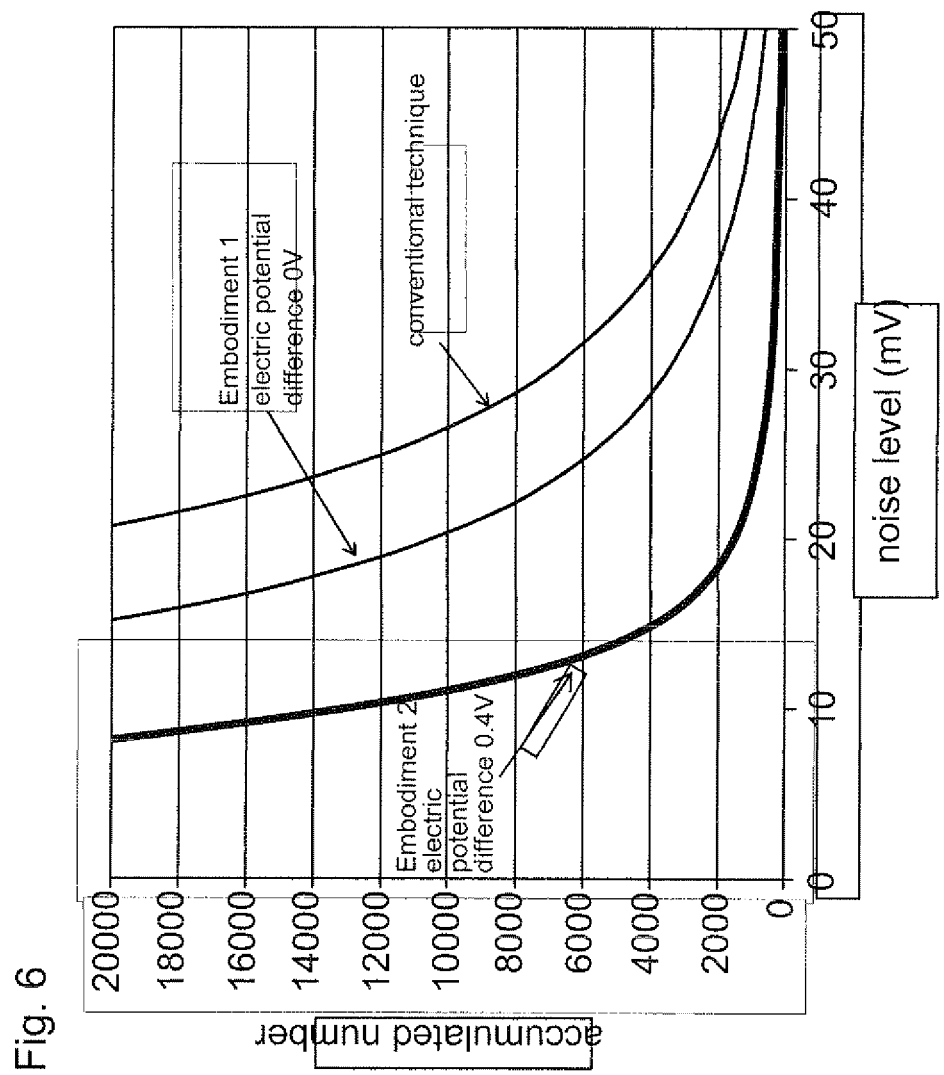
FIG. 6 is a graph illustrating a result of reducing noise electrons in a MOS type solid-state image capturing element according to Embodiment 2.

FIG. 6 is a graph illustrating a result of reducing noise electrons in the MOS type solid-state image capturing element 1A according to Embodiment 2.

As illustrated in FIG. 6, it can be understood that, while the number of noise electrons is less in the MOS type solid-state image capturing element 1 according to Embodiment 1 compared to that in the conventional structure, the noise electrons are further reduced by applying a positive electric potential difference of less than +0.5 V (+0.4 V, herein) in between the transfer gate electrode 10 and the surface p-regions 11 and 12 in the case with the MOS type solid-state image capturing element 1A according to Embodiment 2.

Figure 7:
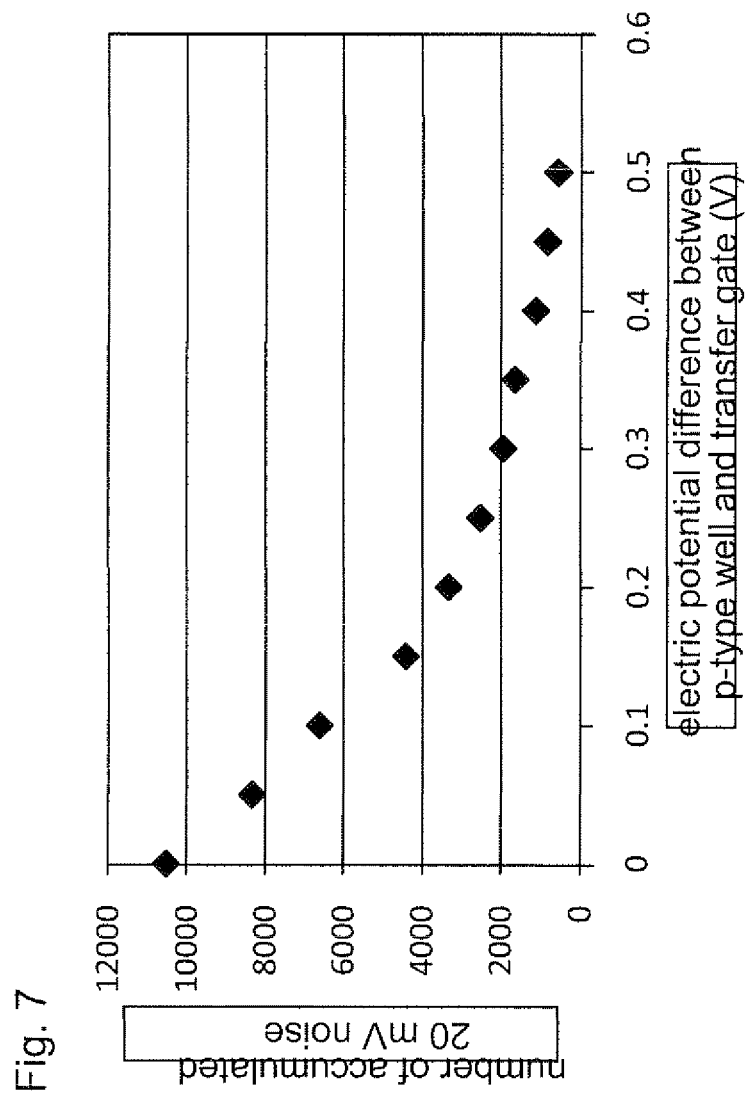
FIG. 7 is a graph illustrating a state where the number of noise electrons is rapidly reduced in the voltage range of between 0 V to +0.5 V of the electric potential difference applied in between the transfer gate electrode and the surface p-regions in the MOS type solid-state image capturing element according to Embodiment 2.

FIG. 7 is a graph illustrating a state where the number of noise electrons is rapidly reduced in the voltage range of between 0 V to +0.5 V for the electric potential difference applied in between the transfer gate electrode 10 and the surface p-regions 11 and 12 in the MOS type solid-state image capturing element 1A according to Embodiment 2.

It can be understood from FIG. 7 that the noise electrons are more sufficiently reduced as the positive electric potential difference of +0.5 V or less in between the transfer gate electrode 10 and the surface p-regions 11 and 12 becomes closer to +0.5 V. A more preferable range is equal to or greater than 0.2 V and less than 0.5 V for the positive electric potential difference.

According to Embodiment 2 with the structure described above, the solid-state image capturing element 1 according to Embodiment 1 is used and the positive electric potential difference of less than +0.5 V is applied in between the transfer gate electrode 10 and the second conductivity type semiconductor region (surface p-regions 11, 12) directly therebelow. As a result, the hole concentration is increased in the p-region of the silicon/silicon oxide film interface and the trapping efficiency of the noise electrons by the holes increases, thereby further reducing the amount of white defects and achieving the improvement on the image quality, compared to the state where the electric potential difference is 0 V in Embodiment 1.

In Embodiment 2, although the positive voltage of less than +0.5 V is applied to the surface p-regions 11 and 12 through the buried p-type semiconductor layer 3 and the p-type well region 5, under a condition where the same ground potential as that of the p-type well region in the peripheral circuit region (0 V) is applied to the transfer gate electrode 10 during the accumulation of electric charges, without the limitation to this, it is also possible to apply the voltage in a reverse manner. That is, it is also possible to apply the electric potential difference of less than +0.5 V in between the transfer gate electrode 10 and the surface p-regions 11 and 12 by applying the same grounding potential as that of the peripheral circuit to the surface p-regions 11 and 12 through the buried p-type semiconductor layer 3 and the p-type well region 5 and applying a negative voltage of 0.5 V or less (−0.4 V, for example), which is supplied by a negative voltage generating circuit added to the peripheral circuit region, to the transfer gate electrode 10. By such an electric potential difference between the transfer gate electrode 10 and the surface p-regions 11 and 12, the holes are gathered towards the transfer gate electrode 10 of the surface p-regions 11 and 12 and the noise electrons generated at the silicon/silicon oxide film interface are trapped. In this case, since the voltage generated by the negative voltage generating circuit is a negative voltage of less than 0.5 V, it is not necessary to add a buffer circuit with a different well electric potential in order to apply a negative voltage in a pixel driving circuit section, which is required in the conventional technique, and also it is not necessary to complicate the circuit configuration.

As described above, with an electric potential of 0.5 V or less, the operation is possible while the well electric potential of the pixel driving circuit is maintained at the grounding potential; and with the negative voltage generating circuit, the negative voltage of less than 0.5 V is applied to the transfer gate electrode 10 so that it becomes possible to achieve the method for driving the MOS type solid-state image capturing element 1A that suppresses dark noise.

Embodiment 3

Figure 8:
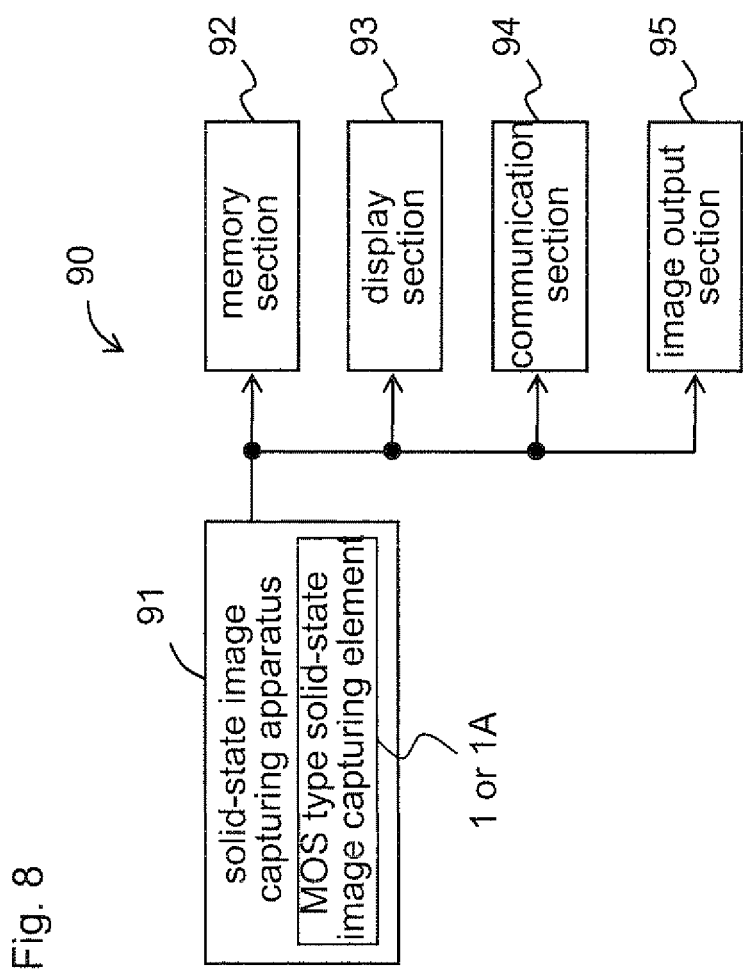
FIG. 8 is a block diagram schematically illustrating an exemplary structure of an electronic information device of Embodiment 3, including the solid-state image capturing element according to Embodiment 1 or 2 used in an image capturing section.
Figure 9:
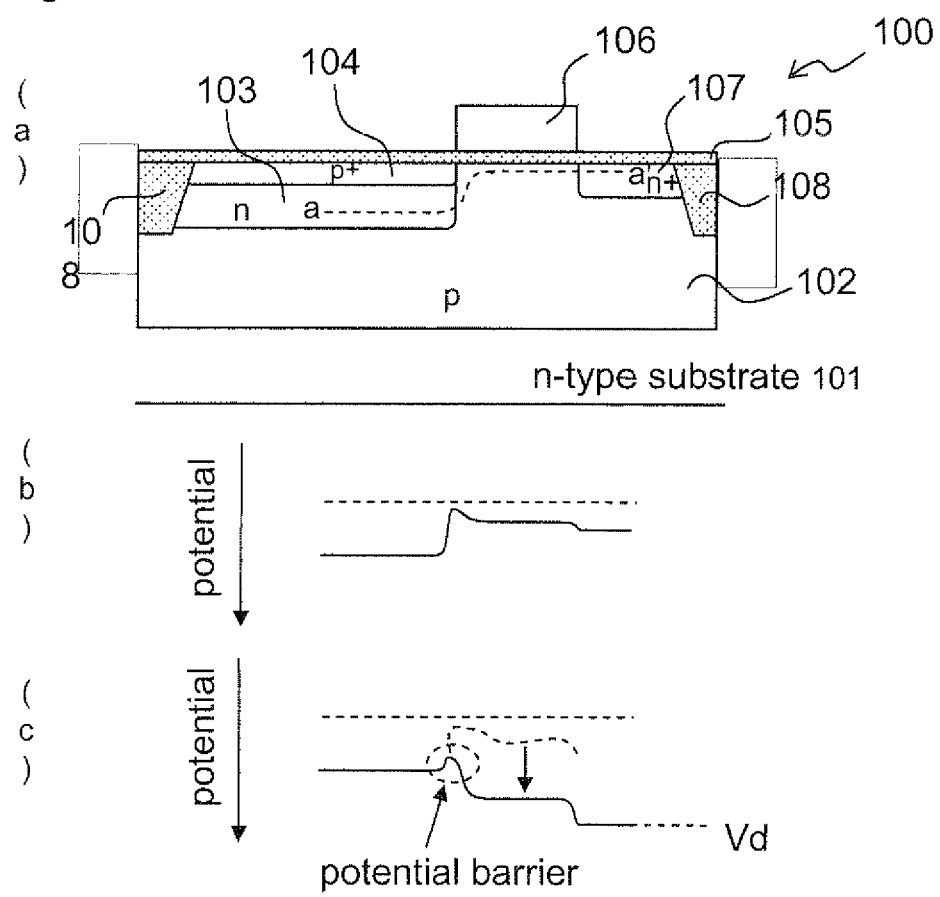
FIG. 9(a) is a longitudinal cross sectional view of a conventional MOS type solid-state image capturing element disclosed as a conventional example in Reference 1, illustrating the solid-state image capturing element for one pixel.
FIGS. 9(b) and 9(c) are each a potential distribution diagram illustrating a transferring path for signal charges, which consists of a photoelectric conversion and accumulation section, a channel region below a gate electrode, and an electric charge detecting section and is taken along the dotted line a-a' in FIG. 9(a).

FIG. 8 is a block diagram schematically illustrating an exemplary structure of an electronic information device of Embodiment 3, including the solid-state image capturing element 1 or 1A according to Embodiment 1 or 2 used in an image capturing section.

In FIG. 8, an electronic information device 90 according to Embodiment 3 includes: a solid-state image capturing apparatus 91 for performing predetermined signal processing on an image capturing signal from the solid-state image capturing elements 1 or 1A according to Embodiment 1 or 2 so as to obtain a color image signal; a memory section 92 (e.g., recording media) for data-recording the color image signal from the solid-state image capturing apparatus 91 after a predetermined signal process is performed on the color image signal for recording; a display section 93 (e.g., a liquid crystal display apparatus) for displaying the color image signal from the solid-state image capturing apparatus 91 on a display screen (e.g., liquid crystal display screen) after predetermined signal processing is performed on the color image signal for display; a communication section 94 (e.g., a transmitting and receiving device) for communicating the color image signal from the solid-state image capturing apparatus 91 after predetermined signal processing is performed on the color image signal for communication; and an image output section 95 (e.g., a printer) for printing the color image signal from the solid-state image capturing apparatus 91 after predetermined signal processing is performed for printing. Without the limitation to this, the electronic information device 90 may include at least any of the memory section 92, the display section 93, the communication section 94, and the image output section 95, other than the solid-state image capturing apparatus 91.

As the electronic information device 90, an electronic device that includes an image input device is conceivable, such as a digital camera (e.g., digital video camera or digital still camera), an image input camera (e.g., a monitoring camera, a door phone camera, a camera equipped in a vehicle including a vehicle back view monitoring camera, or a television telephone camera), a scanner, a facsimile machine, a camera-equipped cell phone device and a portable digital assistant (PDA).

Therefore, according to Embodiment 3, the color image signal from the sensor module 91 can be: displayed on a display screen properly; printed out on a sheet of paper using an image output section 95; communicated properly as communication data via a wire or a radio; stored properly at the memory section 92 by performing predetermined data compression processing; and further various data processes can be properly performed.

Although not described in detail in Embodiment 1, on the surface portion from the upper part of the photodiode region to the electric charge detecting section, disposed are: the second conductivity type first region as a second conductivity type semiconductor pinning layer; a second conductivity type second region, one end of which is adjacent to the second conductivity type first region and which is disposed on an overlapping region of a photoelectric conversion and accumulation section; and a second conductivity type third region, one end of which is adjacent to the second conductivity type second region and the other end of which is adjacent to an electric charge detecting section, and each impurity concentration thereof is set in such a manner to form an electric field being directed from the second conductivity type first region through the second conductivity type second region to the second conductivity type third region. The present invention is achieved, as a matter of course, even if the first conductivity type and the second conductivity type are reversed in this case.

As previously mentioned, the portable electronic information devices are driven by batteries, and therefore, it is important to achieve the lowering of the voltage of the driving electricity and the lowering of the electric power consumption. Owing to the structure described above, the objective of the present invention, or transferring signal charges completely from the photoelectric conversion and accumulation section to the electric charge detecting section under low voltage driving, thereby obtaining high quality images further suppressing noise and after images and greatly suppressing white defects, can be achieved.

As described above, the present technology is exemplified by the use of its preferred Embodiments 1 to 3. However, the present technology should not be interpreted solely based on Embodiments 1 to 3 described above. It is understood that the scope of the present technology should be interpreted solely based on the claims. It is also understood that those skilled in the art can implement equivalent scope of technology, based on the description of the present technology and common knowledge from the description of the detailed preferred Embodiments 1 to 3. Furthermore, it is understood that any patent, any patent application and any references cited in the present specification should be incorporated by reference in the present specification in the same manner as the contents are specifically described therein.

The technology presented herein can be applied in the field of: a solid-state image capturing element, which is constituted of a semiconductor element for performing a photoelectric conversion on and capturing an image of image light from a subject, a method for driving the solid-state image capturing element, and a method for manufacturing the solid-state image capturing element, and more particularly, to a solid-state image capturing element such as a MOS type image sensor capable of being driven with low electric power consumption, a method for driving the solid-state image capturing element, and a method for manufacturing the solid-state image capturing element; and an electronic information device, such as a digital camera (e.g., a digital video camera or a digital still camera), an image input camera (e.g., a monitoring camera), a scanner, a facsimile machine, a television telephone device and a camera-equipped cell phone device, including the solid-state image capturing element as an image input device used in an image capturing section thereof. According to the present invention, it becomes possible to transfer signal charges completely from the photoelectric conversion and accumulation section to the electric charge detecting section under low voltage driving to obtain high quality images further suppressing noise and after images, and greatly suppressing white detects. Further, an identical mask is used and an opening region of the mask is varied and overlapped for ion implantation, so that a more simple structure can facilitate the manufacturing process and white defects can be greatly suppressed.

Various other modifications will be apparent to and can be readily made by those skilled in the art without departing from the scope and spirit of the technology presented herein. Accordingly, it is not intended that the scope of the claims appended hereto be limited to the description as set forth herein, but rather that the claims be broadly construed.

What is claimed is:

1. A solid-state image capturing element, comprising, as a unit pixel section disposed in a semiconductor substrate:
   a photodiode region including a first conductivity type semiconductor region constituting a photoelectric conversion and accumulation section for photoelectrically converting light into signal charges for electric charge accumulation, and a second conductivity type semiconductor pinning layer for separating the photoelectric conversion and accumulation section from a surface of the semiconductor substrate;
a gate electrode one end of which is adjacent to the second conductivity type semiconductor pinning layer, wherein one end portion of the gate electrode overlaps one end portion of the photoelectric conversion and accumulation section; and
an electric charge detecting section as a first conductivity type drain region adjacent to the other end of the transfer gate electrode,
the solid-state image capturing element further comprising, disposed in a surface portion from an upper part of the photodiode region to the electric charge detecting section: a second conductivity type first region as the second conductivity type semiconductor pinning layer; a second conductivity type second region, one end of which is adjacent to the second conductivity type first region and which is disposed in an overlapping region of the photoelectric conversion and accumulation section; and a second conductivity type third region, one end of which is adjacent to the second conductivity type second region and the other end of which is adjacent to the electric charge detecting section,
wherein each impurity concentration of the first, second and third regions is set in a manner to form an electric field being directed from the second conductivity type first region through the second conductivity type second region to the second conductivity type third region,
the second conductivity type third region contacts only the first conductivity type semiconductor region and the second conductivity type second region along a linear boundary separating the second conductivity type third region from the first conductivity type semiconductor region and the second conductivity type second region, at the one end portion of the gate electrode, the linear boundary being perpendicular to the surface of the semiconductor substrate and extending along a portion of both the first conductivity type semiconductor region and the second conductivity type second region, and
the second conductivity type third region and the first conductivity type semiconductor region are formed within a first conductivity type semiconductor substrate.

2. A solid-state image capturing element according to claim 1, wherein
a relationship among an impurity concentration C1 of the second conductivity type first region, an impurity concentration C2 of the second conductivity type second region, and an impurity concentration C3 of the second conductivity type third region is set to be C1>C2>C3.

3. A solid-state image capturing element according to claim 2, wherein
the impurity concentration C1 of the second conductivity type first region is set to be $8\times10^{17}$ cm$^{-3}$ to $3\times10^{18}$ cm$^{-3}$, the impurity concentration C2 of the second conductivity type second region is set to be $9\times10^{16}$ cm$^{-3}$ to $5\times10^{17}$ cm$^{-3}$, and the impurity concentration C3 of the second conductivity type third region is set to be $3\times10^{16}$ cm$^{-3}$ to $1\times10^{17}$ cm$^{-3}$.

4. A solid-state image capturing element according to claim 1, wherein
a relationship among a depth D1 of the second conductivity type first region from a substrate surface, a depth D2 of the second conductivity type second region from the substrate surface, and a depth D3 of the second conductivity type third region from the substrate surface is D3>D1>D2.

5. A solid-state image capturing element according to claim 1, wherein
the first conductivity type semiconductor region is completely buried inside the semiconductor substrate, in a state surrounded by the second conductivity type semiconductor pinning layer thereabove, the gate electrode adjacent to one end of the second conductivity type semiconductor pinning layer, a second conductivity type region adjacent to and extending below the other end portion of the second conductivity type semiconductor pinning layer, and a buried second conductivity type region adjacently below the second conductivity type region and disposed below the first conductivity type semiconductor region.

6. A solid-state image capturing element according to claim 1, wherein
the second conductivity type second region is adjacent to the second conductivity type first region and disposed on the overlapping region of the photoelectric conversion and accumulation section below the gate electrode.

7. A solid-state image capturing element according to claim 1, wherein
a boundary between the second conductivity type first region and the second conductivity type second region lines up with one end of the gate electrode vertically, and a boundary between the second conductivity type second region and the second conductivity type third region lines up with one end of the photoelectric conversion and accumulation section vertically.

8. A solid-state image capturing element according to claim 5, wherein
the second conductivity type region surrounds a region from the first conductivity type semiconductor region to the second conductivity type second region, the second conductivity type third region, and even the electric charge detecting section.

9. A solid-state image capturing element according to claim 1, wherein
a positive electric potential difference of less than +0.5 V is applied in between the transfer gate electrode and the second conductivity type semiconductor region during a period when the photoelectric conversion and accumulation section photoelectrically converts light into signal charges for electric charge accumulation.

10. A solid-state image capturing element according to claim 9, wherein
the positive electric potential difference is in the range equal to or greater than +0.2 V and less than +0.5 V.

11. An electronic information device including a solid-state image capturing element according to claim 1 as an image input device used in an image capturing section thereof.

* * * * *